(12) United States Patent
Sarno et al.

(10) Patent No.: US 9,253,918 B2
(45) Date of Patent: Feb. 2, 2016

(54) RACK INTENDED TO EQUIP AN AERONAUTICAL PLATFORM

(71) Applicant: THALES, Neuilly-sur-Seine (FR)

(72) Inventors: Claude Sarno, Etoile-sur-Rhone (FR); Philippe Oconte, Livron-sur-Drome (FR); Francois Morlet, Guilherand-Granges (FR)

(73) Assignee: Thales, Neuilly-sur-Seine (FR)

( * ) Notice: Subject to any disclaimer, the term of this patent is extended or adjusted under 35 U.S.C. 154(b) by 0 days.

(21) Appl. No.: 14/227,184

(22) Filed: Mar. 27, 2014

(65) Prior Publication Data

US 2015/0083674 A1 Mar. 26, 2015

(30) Foreign Application Priority Data

Mar. 27, 2013 (FR) ..................................... 13 00709

(51) Int. Cl.
*H05K 5/00* (2006.01)
*H05K 7/00* (2006.01)
*G06F 1/16* (2006.01)
*B64C 1/00* (2006.01)
*B64C 30/00* (2006.01)
*G08B 21/00* (2006.01)
*H05K 7/20* (2006.01)
*G11B 33/12* (2006.01)
*G11B 33/14* (2006.01)
*H05K 7/14* (2006.01)
*H05K 7/18* (2006.01)

(52) U.S. Cl.
CPC .......... *H05K 7/20136* (2013.01); *G11B 33/128* (2013.01); *G11B 33/142* (2013.01); *H05K 7/1425* (2013.01); *H05K 7/18* (2013.01); *H05K 7/20581* (2013.01)

(58) Field of Classification Search
CPC ............. G06F 1/16; G06F 1/20; G06F 1/206; H05K 7/14; H05K 7/20; H05K 7/20136; H05K 7/20145
USPC ............... 361/679.01, 679.02, 724, 725, 726, 361/727, 679.46, 679.49, 679.5, 679.51; 340/945; 244/129.1, 1 R, 118.5, 117 R; 248/27.1
See application file for complete search history.

(56) References Cited

U.S. PATENT DOCUMENTS

| | | | | |
|---|---|---|---|---|
| 4,312,041 | A * | 1/1982 | DeJonge | G05D 1/0005 340/963 |
| 4,532,513 | A * | 7/1985 | Halvorson | H05K 7/1427 312/7.2 |
| 6,112,141 | A * | 8/2000 | Briffe | G01C 23/00 345/1.3 |
| 6,803,860 | B1 * | 10/2004 | Langner | G01C 23/00 340/945 |

(Continued)

OTHER PUBLICATIONS

Institute National De La Propriete Industrielle; French Search Report; Dec. 17; 2013; Courbevoie Cedex, France 92677.

*Primary Examiner* — Anthony Haughton
(74) *Attorney, Agent, or Firm* — Michael J. Donohue; Davis Wright Tremaine LLP

(57) ABSTRACT

A rack for an aeronautical platform comprising two parallel shelves positioned between a front face and a rear face of the platform, the rack being inserted into the platform by translation from the front face to the rear face the rack containing electronic equipment extending primarily in a plane, the electronic equipment being positioned in a useful compartment of the rack and cooled by forced convection. The electronic equipment is positioned in such a way that its main plane is parallel to the shelves. The rack comprises means for guiding an air flow used for the cooling of the electronic equipment item, the air flow penetrating into the useful compartment parallel to the plane of the electronic equipment item and at right angles to the direction of insertion of the rack into the platform.

20 Claims, 4 Drawing Sheets

(56) References Cited

U.S. PATENT DOCUMENTS

| | | | | |
|---|---|---|---|---|
| 6,832,138 B1 * | 12/2004 | Straub | ................. | G05D 1/0077 244/1 R |
| 6,985,801 B1 * | 1/2006 | Straub | ................... | G01C 23/00 244/1 R |
| 7,188,400 B1 * | 3/2007 | Beseth | ................. | B64D 43/00 29/428 |
| 7,420,476 B2 * | 9/2008 | Stiffler | ................... | G01C 23/00 340/945 |
| 7,492,591 B1 | 2/2009 | Aybay et al. | | |
| 8,116,082 B2 | 2/2012 | Beaudoin et al. | | |
| 2008/0094255 A1 * | 4/2008 | Bethel | .................... | G01C 23/00 340/971 |
| 2009/0103414 A1 | 4/2009 | Joshi et al. | | |
| 2010/0090868 A1 * | 4/2010 | Hall | ....................... | G01C 23/00 340/971 |
| 2011/0188185 A1 * | 8/2011 | Bopp | ..................... | B64D 43/00 361/679.01 |

* cited by examiner

RACK INTENDED TO EQUIP AN AERONAUTICAL PLATFORM

The invention relates to a rack intended to equip an aeronautical platform. One objective of the invention is to enhance the cooling of electronic equipment items borne by embedded bays or mounted in isolation and autonomously on board aircraft and located in cramped areas.

On board aircraft, the electronic equipment items can come from different companies, each an expert in a particular field. Standards have been developed to enable the different equipment items to be physically installed on board one and the same carrier. As an example, the ARINC 600 standard can be cited which defines a modular design based on equipment items that can be installed on board aircraft. These equipment items are well known in the literature by the name of "Modular Concept Unit (MCU)". The ARINC 600 standard provides standardized heights for the racks. The bays or cabinets intended to receive these racks, although not standardized, are developed accordingly. In these bays or cabinets, the height separating two superposed shelves or two levels of the same shelf is 194 mm. The rack forms an MCU. As a reminder, ARINC (Aeronautical Radio, Incorporated) is an American company whose head office is located in Annapolis, in Md. This company is known for defining the main communication standards inside aircraft and between aircraft and the ground.

In the racks that conventionally equip the ARINC 600 bays, electronic boards are positioned vertically. To cool the boards, a forced air convection can be provided vertically between the boards. The air flow used for the cooling can be brought to the rack via a duct formed in a shelf of the bay on which the rack is placed. Air is taken directly through the bottom face of the rack in order to circulate between the boards.

Other more recent standards are tending to be developed, such as, for example, the EIA-310 standard, which defines formats in which the height is expressed in rack units. One unit (1U) corresponds to 1.75 inches, that is to say 44.45 mm. For example, electronic boards intended to equip 6U racks have dimensions of 233.35×160 mm. EIA (Electronic Industries Alliance) is an organization bringing together manufacturers and users of electronic equipment items. Its head office is located in the United States in Arlington (Va.). Again by way of example, the VITA standard can be cited, developed on the basis of the VME buses and with the head office located in the United States in Fountain Hills (Ariz.). Obviously, the invention can be implemented in any kind of board developed according to a standard different from that implemented for the development of slots intended to receive these boards. This issue often arises when new technologies are to be integrated in older equipment items. This type of integration is known in the literature by the name of "retrofit".

To go back to the example of the EIA-310 standard, it would be desirable to be able to install 6U racks in bays of ARINC 600 type in order to profit from developments made according to the 6U architecture to upgrade aeroplanes whose bays were designed according to the ARINC 600 architecture without modifying the bays. That makes it possible to replace only certain racks while retaining other original racks. However, the racks developed in the 6U format cannot directly fit into the bays of ARINC 600 type.

First of all, in order to retain the cooling mode developed in the ARINC 600 standard, the boards should be placed vertically. It is not possible to place the large side of the boards developed in the 6U format between two shelves of a bay of ARINC 600 type. In practise, the 233.25 mm length of a board in the 6U format is greater than the distance of 194 mm separating two shelves of ARINC 600 type. However, the small side of the boards can be placed vertically. Nevertheless, this arrangement presents a number of drawbacks. First of all, the rack may extend beyond the front face of the shelves which may pose bulk problems. Then, the board connectors are often placed on their large side which greatly complicates the plugging in of the boards into the rack. It is then necessary to remove the rack to reach the boards, which poses cable length problems.

Another solution consists in placing the boards horizontally. One argument against implementing this arrangement would be the difficulty in obtaining a correct cooling of the horizontal boards by a vertical air flow because the bottommost board prevents the air flow from accessing the boards located above.

The invention makes it possible to get around this prejudice by ensuring the cooling of boards installed horizontally. The invention allows for the installation of racks containing boards of 6U type in a bay of ARINC 600 type. The invention is not limited to these two standards and, more generally, the aim of the invention is to allow for the installation of racks containing boards defined according to a first format in a bay defined to receive racks according to a second format, the boards of the first format being larger than those of the second format. To ensure a correct operation of the racks of the first format, the subject of the invention is a system for cooling the rack of the first format that is compatible with the bays of the second format.

To this end, the subject of the invention is a rack intended to equip a platform comprising two parallel shelves positioned between a front face and a rear face of the platform, the rack being intended to be inserted into the platform by translation from the front face to the rear face, the rack containing at least one electronic equipment item extending essentially in a plane, the electronic equipment item being positioned in a useful compartment of the rack, the electronic equipment item being cooled by forced convection, characterized in that the electronic equipment item is positioned in the useful compartment such that its plane is parallel to the shelves, in that the electronic equipment item can be plugged into the rack in the same direction as the direction of insertion of the rack into the platform and in that the rack comprises means for guiding an air flow used for the cooling of the electronic equipment item, the air flow penetrating into the useful compartment parallel to the plane of the electronic equipment item and at right angles to the direction of insertion of the rack into the bay.

The invention will be better understood, and other advantages will become apparent, on reading the detailed description of an embodiment given by way of example, the description being illustrated by the attached drawing in which.

For clarity, the same elements will bear the same references in the different figures.

Figure 1:
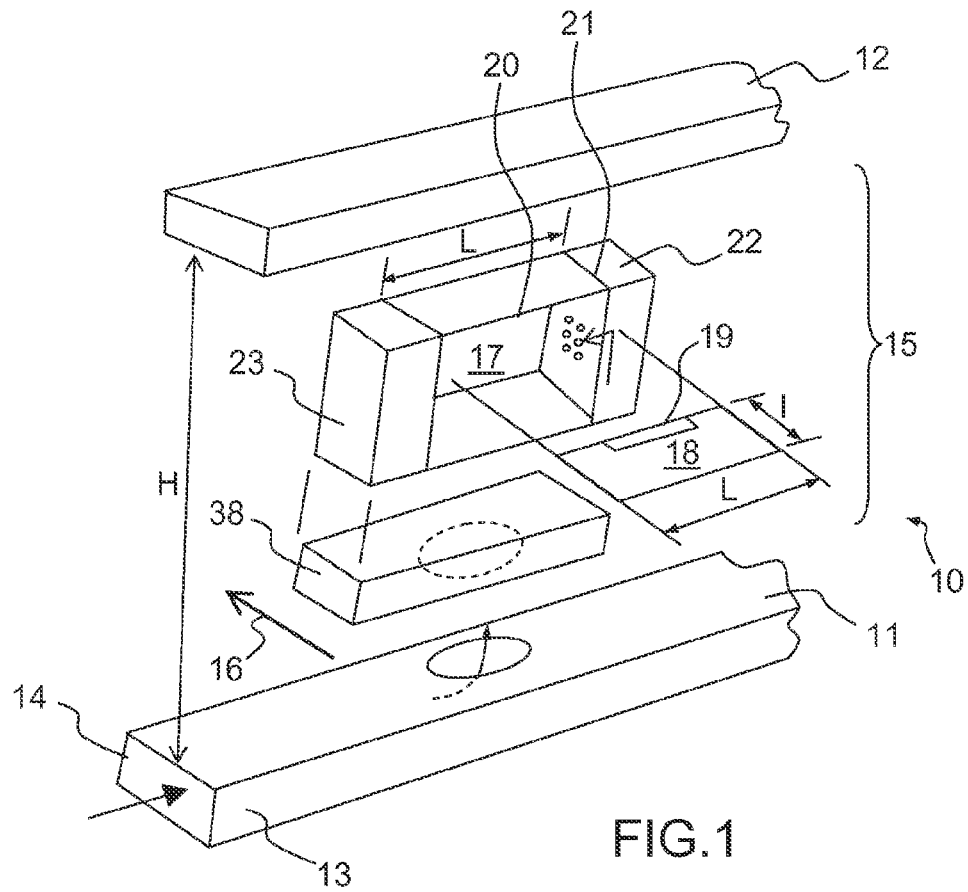
FIG. 1 is a schematic representation in perspective of an exemplary embodiment of a rack according to the invention in its environment.

FIG. 1 represents a bay 10 comprising two mutually parallel planar shelves 11 and 12. In order to better understand the arrangement of the various components of the invention, a distance H separating the two shelves 11 and 12 has been expanded in FIG. 1. Usually, the two shelves 11 and 12 are arranged horizontally and the distance H is measured vertically. Nevertheless, it is possible to implement the invention for other shelf arrangements, for example for vertical shelves.

A front face 13 and a rear face 14 of the bay 10 are defined. The two faces 13 and 14 are at right angles to the planes of the shelves 11 and 12.

A rack 15 is mounted in the bay 10 between the two shelves 11 and 12. The rack 15 is installed by translation in a direction embodied in FIG. 1 by an arrow 16. This direction is at right angles to the faces 13 and 14. The rack 15 is inserted from the front face 13 to the rear face 14.

The example represented shows a rack installed in a bay. It is of course possible to install a rack according to the invention autonomously outside of a bay that might usually contain other electronic equipment items. One example of a bay may be called "avionics bay" by certain aeroplane manufacturers. The term "platform" can be used to encompass any possible container of a rack according to the invention. The platform can therefore be a bay, a cabinet or a simple place provided to receive the rack.

The rack 15 forms a container in which one or more electronic equipment items are positioned. The rack 15 comprises a useful compartment 17 and utility modules which will be detailed later. The electronic equipment items are situated in the useful compartment 17. The utility modules are used to perform ancillary functions distinct from the functions fulfilled by the electronic equipment items. Among these ancillary functions, interest is more particularly focused on the cooling of the electronic equipment items.

The electronic equipment items each extend essentially in a plane. An electronic equipment item is, for example, formed by electronic components borne by a printed circuit board. This type of equipment item is commonly called electronic board. The plane of the printed circuit then forms the main plane of the electronic equipment item. It is also possible to assemble components on a support that does not interconnect the components, the connection then being made by wiring. This type of equipment also extends in a main plane, for example formed by a metal plate on which components are fixed.

The electronic equipment items are positioned in the useful compartment 17 in such a way that their plane is parallel to the shelves 11 and 12. The electronic equipment items are installed in the rack 15 by plugging in in the direction 16. By way of example, an electronic equipment item 18 is represented in FIG. 1. Advantageously, the electronic equipment item 18 comprises a backplane connector 19 positioned in such a way that its direction of insertion is the direction 16. The connector 19 ensures the electrical connection of the equipment item to other equipment items in the rack 15, the bay 10 or even outside the bay 10. The position of the connector 19 makes it possible to mechanically install the equipment item 18 and electrically connect it in a single operation. This operation consists in plugging the equipment item 18 into the rack 15 by translation in the direction 16.

The electronic equipment items 18 can have a rectangular form in their plane. For example, in the 6U format, the equipment items have overall dimensions measured in their plane of 233.35×160 mm, respectively forming a length L and a width l of the electronic equipment item 18. In order to increase the number of connection points of the electronic equipment item 18, it is preferable to position the connector 19 on the large side of the rectangle. It is for example possible to use connectors that have of the order of 1000 connection points. In order to place a rack in the 6U format in a bay in the ARINC 600 format, whose horizontal shelves are separated by a height H of 194 mm, it would be possible to position the equipment items 18 vertically on their edge by positioning the 160 mm width vertically. This arrangement makes it possible to facilitate the cooling of the electronic equipment items 18. In practise, in a vertical arrangement, a natural air convection takes place in addition to a forced convection. This is also the arrangement retained for the racks in the ARINC 600 format. Nevertheless, a vertical arrangement of the equipment items in the 6U format in the bay in the ARINC 600 format leads to the elongate connectors 19 being positioned against a shelf. The equipment items are then inserted vertically and above all at right angles to the direction 16 of insertion of the racks 15 into the bay 10. This arrangement complicates the electrical connection of the equipment items. In practise, in order to plug in or unplug an equipment item, it is necessary to remove the rack from the bay, by sliding it in the direction 16 to be able to access the equipment item. The bay connector complementing the connector 19 of the equipment item has to be placed at the end of a cable whose length allows the rack to be slid out of the shelves. On the other hand, in the arrangement of the invention, that is to say by retaining the same direction for the insertion of the rack 15 into the bay 10 and for the insertion of the equipment items 18 into the rack 15, it is possible to keep the complementary connector fixed in the bay 10 during the installation or the removal of an equipment item. This makes it possible to reduce the bay cable lengths. This cable length reduction makes it possible to reduce the embedded weight in an aircraft equipped with the bay 10. Furthermore, a maintenance operation consisting in replacing an equipment item 18 is simplified. By virtue of the invention, it is not necessary to remove the rack 15 from the bay 10 to access the equipment item 18.

The positioning of the main plane of the equipment items 18 parallel to the plane of the shelves can of course be implemented for standards other than the standards ARINC 600 for the bay 10 and 6U for the equipment items 18. More generally, an overall length L of the electronic equipment item 18 measured at right angles to the direction of insertion 16 can be greater than an overall height H of the rack 15 measured at right angles to the two shelves 12 and 13.

Above, the height H was defined as the distance separating the two shelves 11 and 12. For convenience, the height H is also used for the corresponding height of the rack 15. Obviously, functional plays are provided to allow for the insertion of the rack 15 into the bay 10. A play may also be provided to allow the air to circulate freely. Nevertheless, the nominal heights of the rack 15 and between shelves 12 and 13 are advantageously identical in order to best occupy the space available between two shelves 11 and 12.

The rack 15 and the electronic equipment item or items 18 that it contains are cooled by forced convection of air circulating along the equipment items 18. In other words, in the useful compartment 17, the circulation of the cooling air takes place parallel to the main planes of the electronic equipment items 18. When the shelves are horizontal, the equipment items 18 are also horizontal. The rack 15 comprises means for guiding the air flow used for the cooling of electronic equipment items 18. The air flow penetrates into the useful compartment 17 parallel to the planes of the electronic equipment items 18 and at right angles to the direction 16 of insertion of the rack 15 into the bay 10.

It is possible to have the flow of cooling air for the electronic equipment item 18 penetrate into the useful compartment 17 through a front face 20 of the rack 15, the front face 20 being parallel to the front face 13 of the bay 10. The front face 20 also forms the face of insertion of the electronic equipment item 18 into the rack 15. However, advantageously, the air flow penetrates into the useful compartment 17 through a lateral face 21 of the useful compartment 17, the lateral face 21 being at right angles to the front face 20 and to the plane of the shelves 11 and 12. This arrangement of the air intake into the useful compartment 17 makes it possible to position means for guiding the air flow between the front face 13 and the rear face 14 of the bay 10. Thus, it is possible to keep the air flow guiding means completely in a volume defined between the two faces 11 and 12 of the bay 10.

In a particular arrangement, the guiding means advantageously comprise an inlet box 22 covering a first lateral face 21 of the useful compartment 17. The inlet box 22 ensures the guiding of the air flow towards the useful compartment 17. The inlet box 22 is, for example, parallelepipedal. One of the faces of the parallelepiped is formed by the lateral face 21 of the useful compartment 17. The inlet box 22 comprises an air inlet which can be positioned on any face of the parallelepiped other than the lateral face 21 and an air outlet formed by the lateral face 21. The inlet box 22 is sealed apart from its air inlet and outlet. The use of a sealed box makes it possible to use the internal volume of the inlet box 22 as an air tranquilizing and possibly distribution chamber before the air penetrates into the useful compartment 17. Thus, the risk of possible air turbulences upstream of the outlet orifice of the inlet box 22 is limited. These turbulences could modify the circulation of the air flow in the useful compartment 17. The inlet box 22 can contain distributors making it possible to avoid an excessive dispersion of the air flow between the equipment items 18 situated in proximity to the air inlet and those which are distant therefrom.

Figure 2:
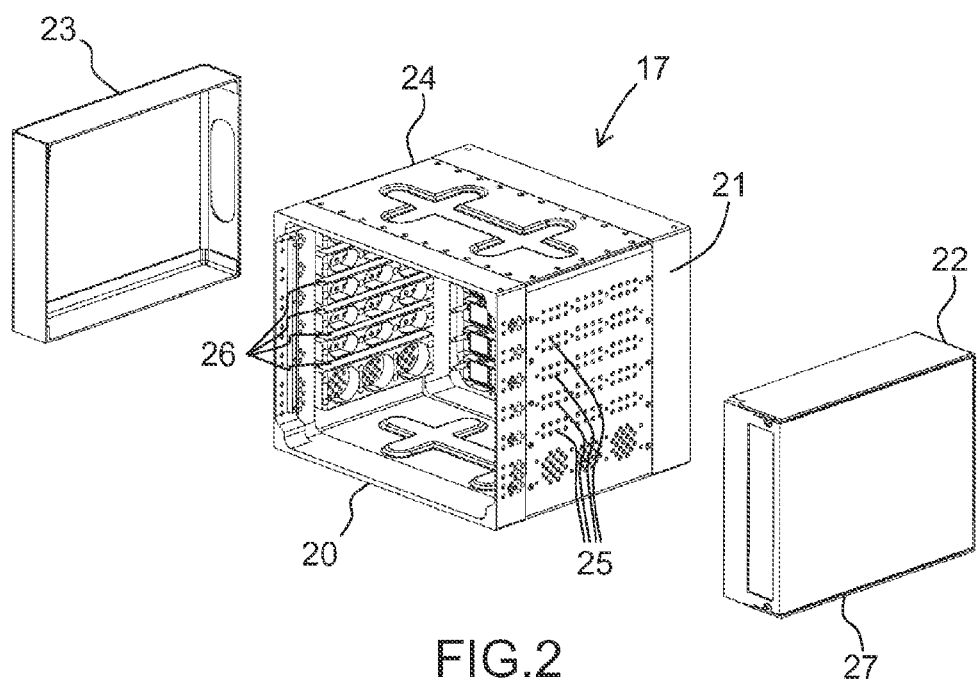
FIG. 2 represents the rack in an exploded perspective view.

FIG. 2 represents an exploded perspective view of the useful compartment 17, the inlet box 22 and an outlet box 23 covering a second lateral face 24 of the useful compartment 17. The lateral face 24 is parallel to the lateral face 21. The outlet box 23 ensures the guiding of the air flow leaving the useful compartment 17. Alternatively, it is possible to dispense with any outlet box and, for example, allow the cooling air flow to exit from the useful compartment 17 directly to the outside through the lateral face 24 or even through the front face 20 of the rack 15. The presence of an outlet box 23 nevertheless makes it possible to better control the air flow at the outlet of the useful compartment 17.

The outlet of the air flow through the outlet box 23 requires the front and rear faces of the compartment to have a level of seal-tightness that is compatible with the cooling of the electronic equipment items 18. At the front face 20, each of the equipment items 18 can have a plate. The plates of the different equipment items 18 form, once assembled in the rack 15, the front face 20. A door ensuring this seal-tightness can also be used.

Like the inlet box 22, the outlet box 23 is, for example, parallelepipedal. One of the faces of the parallelepiped is formed by the lateral face 24 of the useful compartment 17. The outlet box 23 comprises an air inlet formed by the lateral face 24 and an air outlet which can be positioned on any face of the parallelepiped other than the lateral face 24 depending on the installation constraints of the bay 10.

So as to allow the passage of the air flow from the inlet box 22 to the useful compartment 17, the guiding means comprise, for example, piercings 25 produced in the lateral face 21 of the useful compartment 17.

The two lateral faces 21 and 24 can serve as a support for the electronic equipment item or items 18. To facilitate the insertion of the electronic equipment items 18, the two lateral faces 21 and 24 may comprise guideways 26 in which the equipment items 18 slide when they are inserted into the useful compartment 17. When the equipment items 18 are electronic boards, the printed circuits can slide in board guides belonging to the lateral faces 21 and 24 or mounted on these faces. In FIG. 2, only the guideways 26 of the lateral face 24 are visible. The lateral face 21 comprises symmetrical guideways 26. The piercings 25 are produced between the guideways 26 of the lateral face 21.

Among the electronic equipment items 18 installed in the rack 15, some may require more cooling than others, and it may be necessary to define a distribution of the air flow according to the needs of each of the equipment items 18. The piercings 25 are then advantageously defined according to the desired distribution of the air flow in the useful compartment 17.

The lateral face 24 may also comprise piercings similar to the piercings 25 so as to allow the passage of the air flow from the useful compartment 17 to the outlet box 23.

Alternatively, the passage of the air flow from the inlet box 22 to the useful compartment 17 can take place through guideways 26 of the face 21. Similarly, the air can leave the useful compartment 17 through guideways 26 of the face 24. The means for guiding the air flow used for the cooling of the electronic equipment item or items 18 are then partly contained in the equipment item or items 18 themselves.

Figure 3:
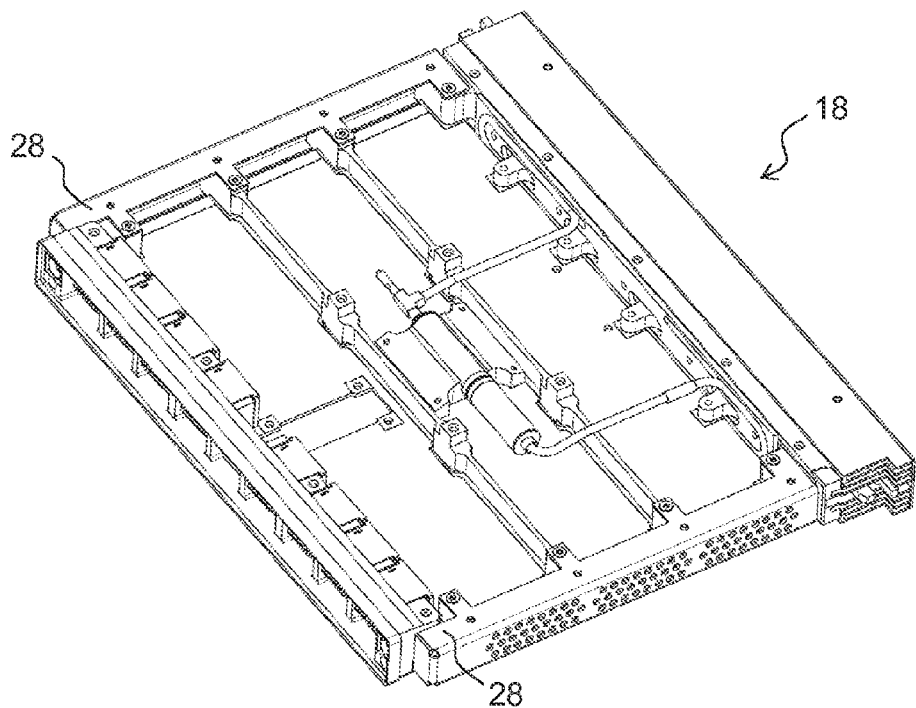
FIGS. 3, 4, 5 and 6 represent a variant of means for guiding air for cooling the rack.
Figure 4:
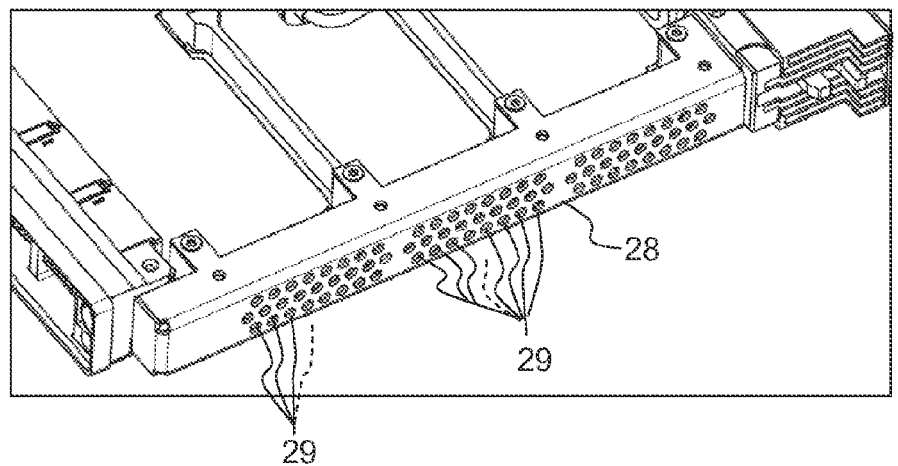
Figure 5:
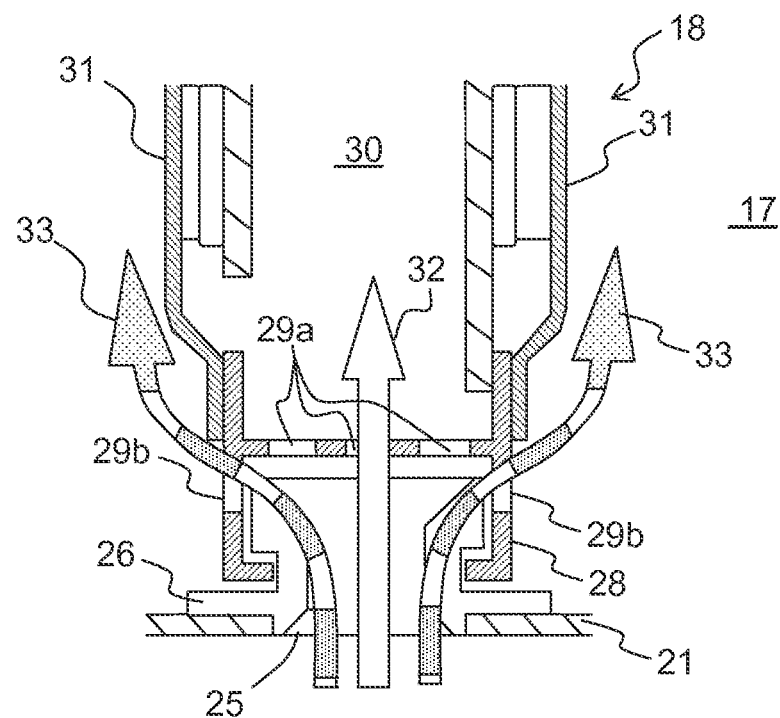

This variant is illustrated in FIGS. 3, 4 and 5. More specifically, the equipment item 18 is equipped with slides 28 making it possible to guide the equipment item 18 in the guideways 26 and to guide the air flow passing through the piercings 25. FIG. 3 shows a perspective view of an equipment item 18 that has two slides 28 each ensuring the guiding of the equipment item 18 in one of the faces 21 and 24. FIG. 4 represents an enlarged view of one of the slides 28 in which piercings 29 can be distinguished that are intended to be in line with the piercings 25 when the equipment item 18 is in the operational position in the useful compartment 17.

FIG. 5 represents an exemplary embodiment of a guideway 26 and a slide 28 associated with this guideway. FIG. 5 is a cross-sectional representation in a plane at right angles to the direction 16 in which the equipment item 18 is plugged into the useful compartment 17. The guideway 26 is fixed to the face 21 and forms the piercing 25 allowing the cooling air to penetrate into the useful compartment 17. The slide 28 here ensures the distribution of the air passing through the piercing 25. In this example, the equipment item 18 must be cooled via an internal channel 30 and along its outer lateral faces 31. The slide 28 comprises one or more openings 29a connecting the piercing 25 and the internal channel 30. The air flow passing through the piercing 25 and one of the openings 29a is shown by an arrow 32. The slide 28 also comprises one or more openings 29b allowing the air circulating in the piercing 25 to circulate along the faces 31. The air flow passing through the piercing 25 and the openings 29b is shown by arrows 33. In this way, the guideway 26 can be standardized. The same guideway can be used for all the equipment items 18. The distribution of the cooling air, both in direction and in flow rate, is assured by the slides 28 which are specific to each of the equipment items 18. The slides 28 are defined according to the cooling requirement specific to each equipment item 18.

Figure 6:
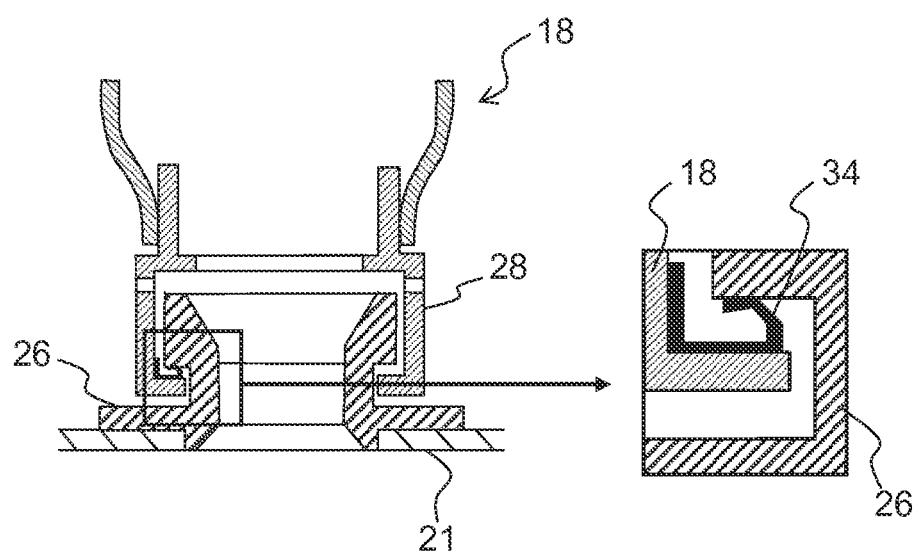

In order to improve the air-tightness between a guideway 26 and a slide 28, it is possible to insert a seal 34 between a guideway 26 and the corresponding slide 28, as represented in FIG. 6.

Figure 7:
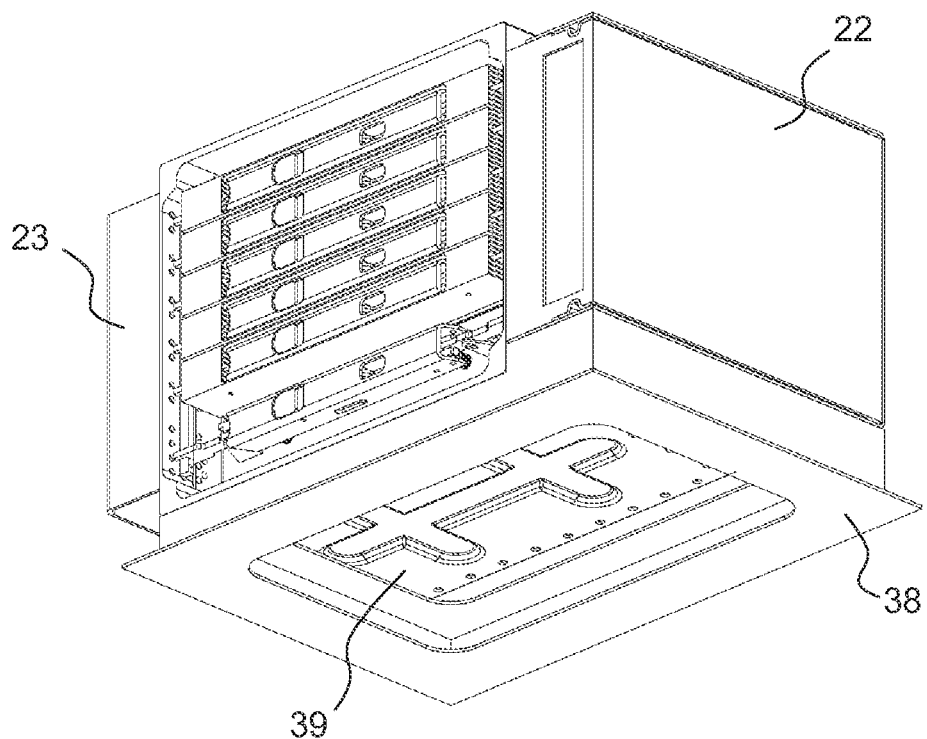
FIG. 7 represents a variant in which a rack cooling air flow comes from beneath the rack.

FIG. 7 represents a variant of rack 15 in which the air flow comes from under the rack 15. Some aeronautical bays are equipped with shelves in which a channel circulates making it possible to deliver an air flow used for the cooling of the various racks with which the bay is equipped. When the rack 15 is intended to equip such a bay, the guiding means are adapted to allow the air flow coming from one of the shelves, called bottom shelf 11, to be guided towards the useful compartment 17 of the rack 15.

To this end, the air inlet of the inlet box 22 can be situated on a bottom face 27 of the inlet box 22. This air inlet is intended to communicate with an opening formed in the shelf 11 in order to take air into the channel of the shelf 11 to cool the equipment items 18 positioned in the useful compartment 15.

The air flow circulates in the form of the letter U:
first branch of the U in the shelf 11,
central part of the U in the inlet box 22,
second branch of the U in the useful compartment 17 of the rack 15, parallel to the electronic equipment items 18.

Since the electronic equipment items 18 are parallel to the shelf 11, in the circulation of the air flow, the two branches of the U are parallel.

As an alternative to supplying air to the rack 15 directly from the shelf 11 to the inlet box 22, the guiding means can comprise a console 38 bearing the useful compartment 15. This alternative is represented in FIG. 3. The console 38 ensures the guiding of the air flow originating from the bottom shelf 11 to the useful compartment 15. The console 38 for example takes the form of a rectangular frame whose surface makes up the bottom face 27 of the inlet box 22 and a bottom face 39 of the useful compartment. The rectangular frame delimits a closed volume situated between, on the one hand, the bottom shelf 11 and, on the other hand, the bottom faces 27 and 39 of the inlet box 22 and a bottom face 39. The closed volume is situated inside the console. The bottom shelf 11 comprises an opening allowing the air flow to enter into the internal volume of the console 38. The bottom face 27 of the inlet box 22 comprises an opening to the internal volume of the console 38 to make the air flow circulate from the internal volume of the console 38 to the inlet box 22. The presence of the console 38 makes it possible to adapt to any standardized openings provided in the shelf 11. The console 38 is then able to cover at least one opening of the shelf 11. In order to enhance the seal-tightness, the use of a seal between the bottom face 39 of the console 38 and the shelf 11 can be envisaged. This seal may be similar to the seal 34 used between the guideway 26 and the slide 28. Even with the console 38, the air circulation is in the form of a U.

Advantageously, the means for guiding the air flow comprise at least one fan making it possible to drive the air flow used for the cooling of the electronic equipment item or items 18.

The fan may be the main means for driving the cooling air flow in the absence of any air channel provided in the shelf 11. It is also possible to include a fan even when the rack 15 is designed to be installed in a bay 10 delivering the cooling air flow. The fan makes it possible to maintain an air flow should the bay fail in its delivery of the air flow.

Figure 8:
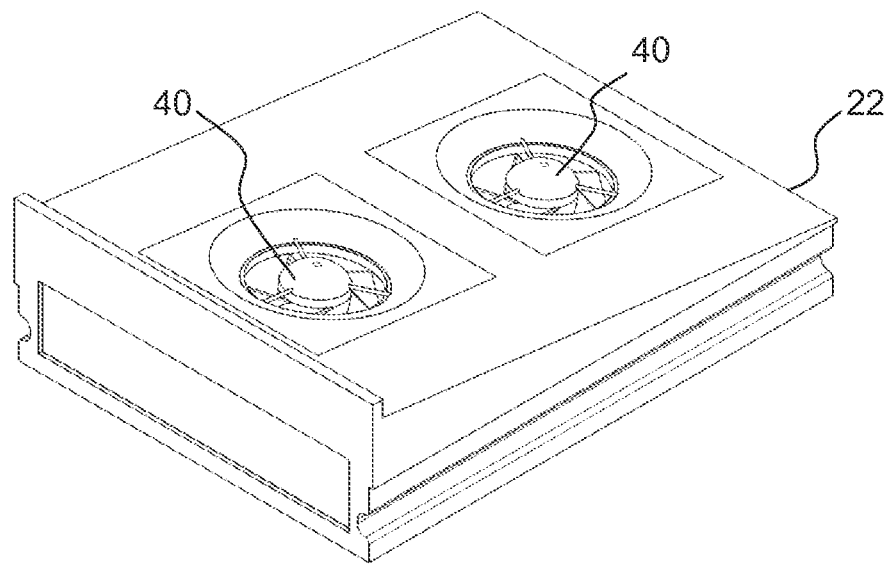
FIG. 8 represents a variant in which two fans are used to drive the air flow used for the cooling of the rack.

The fan can be positioned upstream of the useful compartment 17 in the inlet box 22, as represented in FIG. 8 where the inlet box 22 comprises two fans 40, or optionally in the console 38 if there is one. It is also possible to position the fan downstream of the useful compartment 17, for example in the outlet box 23.

The invention claimed is:

1. Rack intended to equip a platform comprising two parallel shelves positioned between a front face and a rear face of the platform, the rack being intended to be inserted into the platform by translation from the front face to the rear face, the rack containing at least one electronic equipment item extending primarily in a plane, the electronic equipment item being positioned in a useful compartment of the rack, the electronic equipment item being cooled by forced convection, the electronic equipment item being positioned in the useful compartment such that its main plane is parallel to the shelves, in that the electronic equipment item can be plugged into the rack in the same direction as the direction of insertion of the rack into the platform and in that the rack comprises means for guiding an air flow used for the cooling of the electronic equipment item, the air flow penetrating into the useful compartment parallel to the plane of the electronic equipment item and at right angles to the direction of insertion of the rack into the platform.

2. Rack according to claim 1, wherein the guiding means comprise an inlet box covering a first lateral face of the useful compartment, and wherein the inlet box ensures the guiding of the air flow towards the useful compartment.

3. Rack according to claim 2, wherein the guiding means comprise piercings produced in the first lateral face of the useful compartment so as to allow the passage of the air flow from the inlet box to the useful compartment, the piercings being defined according to a desired distribution of the air flow in the useful compartment.

4. Rack according claim 3, wherein the guiding means comprise at least one fan making it possible to drive the air flow used for the cooling of the electronic equipment item.

5. Rack according to claim 3, wherein the guiding means comprise an outlet box covering a second lateral face of the useful compartment, and in that the outlet box ensures the guiding of the air flow leaving the useful compartment.

6. Rack according to claim 3, wherein one of the shelves, called bottom shelf, can deliver the air flow used for the cooling of the electronic equipment item, and in that the guiding means are configured to allow the guiding of the air flow originating from the bottom shelf to the useful compartment of the rack.

7. Rack according to claim 6, wherein the guiding means comprise a console bearing the useful compartment, and in that the console ensures the guiding of an air flow originating from the bottom shelf to the useful compartment.

8. Rack according claim 2, wherein the guiding means comprise at least one fan making it possible to drive the air flow used for the cooling of the electronic equipment item.

9. Rack according to claim 2, wherein the guiding means comprise an outlet box covering a second lateral face of the useful compartment, and in that the outlet box ensures the guiding of the air flow leaving the useful compartment.

10. Rack according to claim 2, wherein one of the shelves, called bottom shelf, can deliver the air flow used for the cooling of the electronic equipment item, and in that the guiding means are configured to allow the guiding of the air flow originating from the bottom shelf to the useful compartment of the rack.

11. Rack according to claim 10, wherein the guiding means comprise a console bearing the useful compartment, and in that the console ensures the guiding of an air flow originating from the bottom shelf to the useful compartment.

12. Rack according to claim 1, wherein an overall length of the electronic equipment item measured at right angles to the direction of insertion is greater than an overall height of the rack measured at right angles to the two shelves.

13. Rack according to claim 1, wherein characterized in that the electronic equipment item comprises a backplane connector positioned in such a way that its direction of insertion is the direction of insertion of the rack into the platform.

14. Rack according to claim 1, wherein the guiding means comprise at least one fan making it possible to drive the air flow used for the cooling of the electronic equipment item.

15. Rack according to claim 14, wherein one of the shelves, called bottom shelf, can deliver the air flow used for the cooling of the electronic equipment item, and in that the guiding means are configured to allow the guiding of the air flow originating from the bottom shelf to the useful compartment of the rack.

16. Rack according to claim 15, wherein the guiding means comprise a console bearing the useful compartment, and in that the console ensures the guiding of an air flow originating from the bottom shelf to the useful compartment.

17. Rack according to claim 14, wherein the guiding means comprise an outlet box covering a second lateral face of the useful compartment, and in that the outlet box ensures the guiding of the air flow leaving the useful compartment.

18. Rack according to claim 17, wherein one of the shelves, called bottom shelf, can deliver the air flow used for the cooling of the electronic equipment item, and in that the guiding means are configured to allow the guiding of the air flow originating from the bottom shelf to the useful compartment of the rack.

19. Rack according to claim 1, wherein one of the shelves, called bottom shelf, can deliver the air flow used for the cooling of the electronic equipment item, and in that the guiding means are configured to allow the guiding of the air flow originating from the bottom shelf to the useful compartment of the rack.

20. Rack according to claim 19, wherein the guiding means comprise a console bearing the useful compartment, and in that the console ensures the guiding of an air flow originating from the bottom shelf to the useful compartment.

* * * * *